(12) United States Patent
Srivastava et al.

(10) Patent No.: US 8,576,523 B2
(45) Date of Patent: Nov. 5, 2013

(54) CHARGE PUMP ELECTROSTATIC DISCHARGE PROTECTION

(75) Inventors: Ankit Srivastava, San Diego, CA (US);
Eugene R. Worley, Irvine, CA (US);
Guoqing Miao, San Diego, CA (US);
Xiaohong Quan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 191 days.

(21) Appl. No.: 13/047,683

(22) Filed: Mar. 14, 2011

(65) Prior Publication Data
US 2012/0236444 A1    Sep. 20, 2012

(51) Int. Cl.
*H02H 9/00*    (2006.01)
*H02H 1/00*    (2006.01)
*H02H 1/04*    (2006.01)
*H02H 3/22*    (2006.01)

(52) U.S. Cl.
USPC .......................................... 361/56; 361/118

(58) Field of Classification Search
USPC ........................................................ 361/56
See application file for complete search history.

(56) References Cited

U.S. PATENT DOCUMENTS

| | | | | |
|---|---|---|---|---|
| 5,581,454 A * | 12/1996 | Collins | ........................ | 363/59 |
| 7,054,123 B2 | 5/2006 | Ausserlechner et al. | | |
| 2009/0196510 A1 | 8/2009 | Gokturk et al. | | |
| 2009/0290794 A1 | 11/2009 | Marchesotti | | |
| 2010/0149703 A1 | 6/2010 | Yeh et al. | | |
| 2011/0221398 A1* | 9/2011 | Ferber, Jr. | ........................ | 320/166 |
| 2011/0241766 A1* | 10/2011 | Zhang et al. | ........................ | 327/536 |
| 2012/0106847 A1 | 5/2012 | Qi | | |

FOREIGN PATENT DOCUMENTS

WO    2007063474 A2    6/2007

OTHER PUBLICATIONS

Chang I C., et al., "Image Segmentation by Local Entropy Methods", International Conference on Image Processing, 1995 Proceedings., pp. 61-64, vol. 3, Oct. 23-26, 1995.
Feng C. T., et al., "Entropy of images after wavelet transform", Journal of Chongqing University (English Edition) [ISSN 1671-8224] vol. 7 No. 1, Mar. 2008, pp. 73-78, Article ID: 1671-8224(2008)01-0073-06.
Hao S, et al., "Combining local affine frames and SIFT for remote sensing image registration", Proc. Of SPIE vol. 7494 74941B-1-6, Oct. 30, 2009.

(Continued)

*Primary Examiner* — Dharti Patel
(74) *Attorney, Agent, or Firm* — Ramin Mobarhan

(57) ABSTRACT

Techniques for electrostatic discharge (ESD) protection for amplifiers and other circuitry employing charge pumps. In an exemplary embodiment, a Vneg switch coupling a second flying capacitor node to a negative output voltage node is closed in response to an ESD event being detected between a supply voltage node and the negative output voltage node. A ground switch coupling a ground node to the second flying capacitor node is closed in response to an ESD event being detected between the ground node and the negative output voltage node. The Vneg switch is further closed in response to the ESD event being detected between the ground node and the negative output voltage node. Further techniques are disclosed for providing on-chip snapback clamps at the output of a power amplifier coupled to the charge pump to protect against ESD events as defined by the standard IEC 61000-4-2.

24 Claims, 14 Drawing Sheets

(56) References Cited

OTHER PUBLICATIONS

Hongkai X. et al., "Subgraphs Matching-Based Side Information Generation for Distributed Multiview Video Coding", EURASIP Journal on Advances in Signal Processing, vol. 2009 (2009), Article ID 386795, retrieved from http://downloads.hindawi.com/journals/asp/2009/386795.pdf Oct. 28, 2010.

International Search Report and Written Opinion—PCT/US2012/029129—ISA/EPO—Jul. 5, 2012.

Jun G. et al., "Multispectral remote sensing image registration based on maximally stable extremal regions", Proc. Of SPIE vol. 7494 749412-1-6, Oct. 30, 2009.

Kristan K. et al., "Entropy Based Measure of Camera Focus", corrected version from ERK2004, retrieved from http://citeseerx.ist.psu.edu/viewdoc/download doi:=10.1.1.59,7145&rep=repl&type=pdf Oct. 28, 2010.

Linear Discriminant Analaysis, http://en.wikipedia.org/wiki/Linear discriminant analysis, retrieved Oct. 28, 2010.

Lowe D. G,"Distinctive image features from scale-invariant key points," International Journal of computer vision, vol. 60, pp. 91-110, 2004.

Rafael C. G. et al., "Digital Image Processing Using MATLAB", Pearson Education Inc., Chapter 11, Representation and Description, pp. 426-483, 2004.

Shi, et al., "Normalized Cuts and Image Segmentation," IEEE Transactions on Pattern Analysis and Machine Intelligence, vol. 22, No. 8, pp. 888-905, Aug. 2000.

Stein A., et al., "Incorporating Background Invariance into Feature-Based Object Recognition", 2005 Seventh IEEE Workshops on Applications of Computer Vision (WACV/MOTION05)—Jan. 5-7, 2005—Breckenridge, CO, USA, IEEE, Los Alamitos, Calif., USA, Jan. 1, 2005, pp. 37-44, XP031059066, ISBN: 978-0/7695-2271-5.

Tuceryan M., et al., "Chapter 2.1, Texture Analysis", Handbook Of Pattern Recognition and Computer Vision, Jan. 1, 1998, pp. 207-248.

Wagan I, et al., "Map Quality Assessment", Performance Metrics for Intelligent Systems archive Proceedings of the 8th Workshop on Performance Metrics for Intelligent Systems table of contents Gaithersburg, Maryland Session: Technical sessions table of contents, ACM, pp. 278-282 Year of Publication: 2008.

Wang J et al., Relative entropy-based methods for image thresholding, Circuits and Systems, 2002 IEEE International Symposium, pp. 11-265-11-268 vol. 2, 2002.

Yu S X, et al., "Object-specific figure-ground segregation", Proceedings/2003 IEEE Computer Society Conference on Computer Vision and Pattern Recognition, June 18-20, 2003, Madison, Wisconsin; [Proceedings of the IEEE Computer Conference on Computer Vision and Pattern Recognition], Los Alamitos, Calif. [U.A, vol. 2, Jun. 18, 2003, pp. 39-45, XP010644586, DOI: 10.1109/CVPR.2003.1211450 ISBN: 978-0/7695-1900-5.

Ayers, et al., "Home Interior Classification using SIFT Keypoint Histograms," IEEE Conference on Computer Vision and Pattern Recognition, Jun. 22, 2007, pp. 1-6.

Duda, et al., "Pattern Classification," Chapter 10, 2nd Edition, 2001, John Wiley and Sons Inc, pp. 1-68.

Gemperline, et al., "Raw Material Testing Using Soft Independent Modeling of Class Analogy Analysis of Near-Infrared Reflectance Spectra," Analytical Chemistry, Jan. 15, 1989, pp. 138-144, vol. 61 (2).

Yang Ke, et al., "PCA-SIFT: A More Distinctive Representation for Local Image Descriptors", Proceedings of the 2004 IEEE Computer Society Conference on Computer Vision and Pattern Recognition (CVPR'04), 2004, pp. II-506-II-513, vol. 2.

\* cited by examiner

CHARGE PUMP ELECTROSTATIC DISCHARGE PROTECTION

BACKGROUND

1. Field

The disclosure relates to electrical discharge protection, and in particular, to electrostatic discharge (ESD) protection for amplifiers and other circuitry employing charge pumps.

2. Background

Charge pumps are commonly utilized in electronic circuitry to step a given voltage supply level up or down, and/or to invert the supply to an inverse voltage level to power a load. A charge pump may find application in, e.g., a class G amplifier architecture, wherein the supply voltages provided to an amplifier may be varied depending on the level of the input signal to be amplified. Charge pumps may also be employed to power other types of loads besides amplifiers.

To protect the terminals of a charge pump from electrostatic discharge (ESD), protection devices such as Zener diodes and RC-triggered power clamps may be coupled between terminals susceptible to ESD. Such protection devices may shunt ESD current away from the charge pump circuitry and other circuitry coupled to the terminals, thus preventing damage to such circuitry. Examples of ESD levels which a circuit may need to withstand may be as described according to, e.g., a human body model (HBM) known in the art, or the standard IEC 61000-4-2, published by the International Electrotechnical Commission. Conventional ESD protection devices may employ either on-chip or off-chip components, with off-chip components being typically more expensive than on-chip components.

During normal charge pump operation, one or more output supply voltages of the charge pump may be switched between low and high levels, depending on a gain mode selected for the charge pump. Such gain switching of the charge pump output supply voltages may inadvertently cause one or more clamps coupled to the supply voltages to turn on, undesirably leading to current leakage through the clamps. Alternatively, current drawn by a load from the charge pump may cause a large ripple to be present on the charge pump output supply voltage, also contributing to current leakage through the clamps.

It would be desirable to provide ESD protection techniques optimally compatible with charge pump operation. It would be further desirable to provide techniques for integrating such ESD protection techniques on-chip to lower their cost of implementation.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The detailed description set forth below in connection with the appended drawings is intended as a description of exemplary aspects of the invention and is not intended to represent the only exemplary aspects in which the invention can be practiced. The term "exemplary" used throughout this description means "serving as an example, instance, or illustration," and should not necessarily be construed as preferred or advantageous over other exemplary aspects. The detailed description includes specific details for the purpose of providing a thorough understanding of the exemplary aspects of the invention. It will be apparent to those skilled in the art that the exemplary aspects of the invention may be practiced without these specific details. In some instances, well-known structures and devices are shown in block diagram form in order to avoid obscuring the novelty of the exemplary aspects presented herein.

Figure 1:
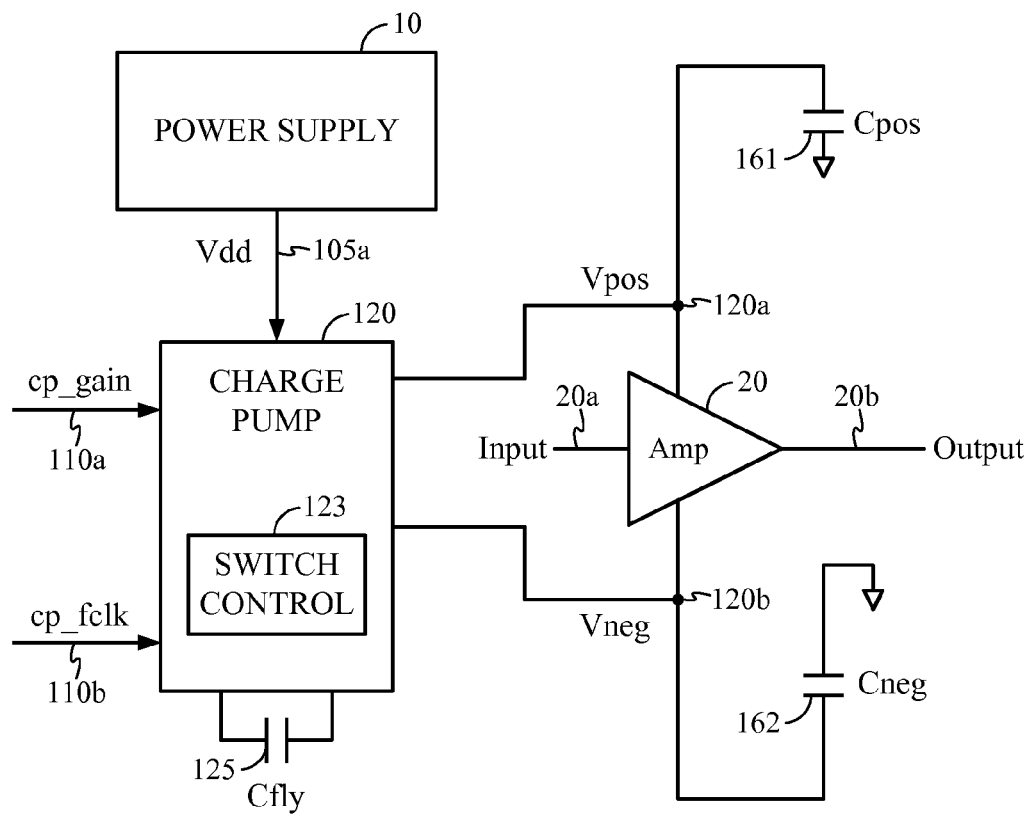
FIG. 1 illustrates an exemplary embodiment of a charge pump application according to the present disclosure.

FIG. 1 illustrates an exemplary embodiment of a charge pump application according to the present disclosure. Note the charge pump application shown in FIG. 1 is shown for illustrative purposes only, and is not meant to limit the scope of the present disclosure to any particular charge pump application.

In FIG. 1, a charge pump 120 is provided with a supply voltage Vdd 105a from a power supply 10. In an exemplary embodiment, the power supply 10 may be, e.g., a switched-mode power supply (SMPS) that may also supply power to other electronic modules. The charge pump 120 generates output voltages Vpos 120a and Vneg 120b from the voltage Vdd 105a by configuring a plurality of switches (not shown in FIG. 1) in the charge pump 120 to successively charge and discharge a flying capacitor Cfly 125. In the exemplary embodiment shown, the charge pump gain, or the relative gain from the level of Vdd to the levels of Vpos and Vneg, is controlled by a control signal cp_gain 110a. Likewise, the charge pump switching frequency, which determines the frequency at which the internal charge pump switches are activated, is controlled by a control signal cp_fclk 110b. The control signals cp_gain and cp_fclk may be provided to a switch control module 123 which controls the opening and closing of the internal charge pump switches.

As shown in FIG. 1, capacitors Cpos 161 and Cneg 162 may be provided to store the energy supplied by the charge pump, and to maintain the voltage levels Vpos 120a and Vneg 120b, respectively, to supply power to an amplifier 20. The power amplifier 20 amplifies an input voltage at node 20a to generate an output voltage at node 20b.

Figure 2:
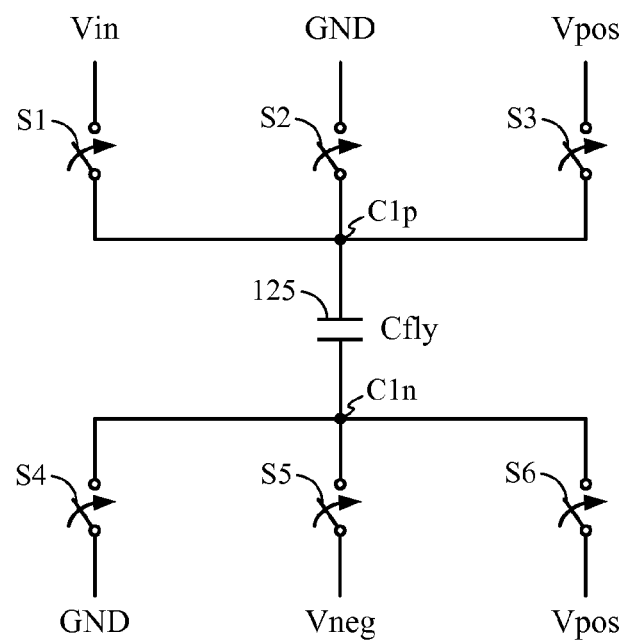
FIG. 2 illustrates an exemplary embodiment of the internal switches within a charge pump according to the present disclosure.

FIG. 2 illustrates an exemplary embodiment of the internal switches within a charge pump according to the present disclosure. Note the particular charge pump shown in FIG. 2 is described for illustrative purposes only, and is not meant to limit the scope of the present disclosure to any particular implementation of switches in a charge pump. One of ordinary skill in the art will appreciate that an alternative number and/or topology of switches may be used to accomplish the same functions as described herein with reference to FIG. 2. Such alternative exemplary embodiments are contemplated to be within the scope of the present disclosure.

In FIG. 2, the flying capacitor Cfly 125 has nodes C1p, C1n coupled to a plurality of switches S1-S6. C1p and C1n may also be denoted herein as the first and second flying capacitor nodes, respectively. The switches S1-S6 are configured to open and close, e.g., by the switch control module 123 shown in FIG. 1, over a series of operational phases as further described hereinbelow to generate the output voltages Vpos 120a and Vneg 120b. In particular, in a first gain mode corresponding to Gain=½, Vpos 120a and Vneg 120b may correspond to Vdd/2 and −Vdd/2, respectively, while in a second gain mode corresponding to Gain=1, Vpos 120a and Vneg 120b may correspond to Vdd and −Vdd, respectively.

Note the switch S4 may also be denoted herein as the "ground switch," while the switch S5 may also be denoted herein as the "Vneg switch."

Figure 2A:
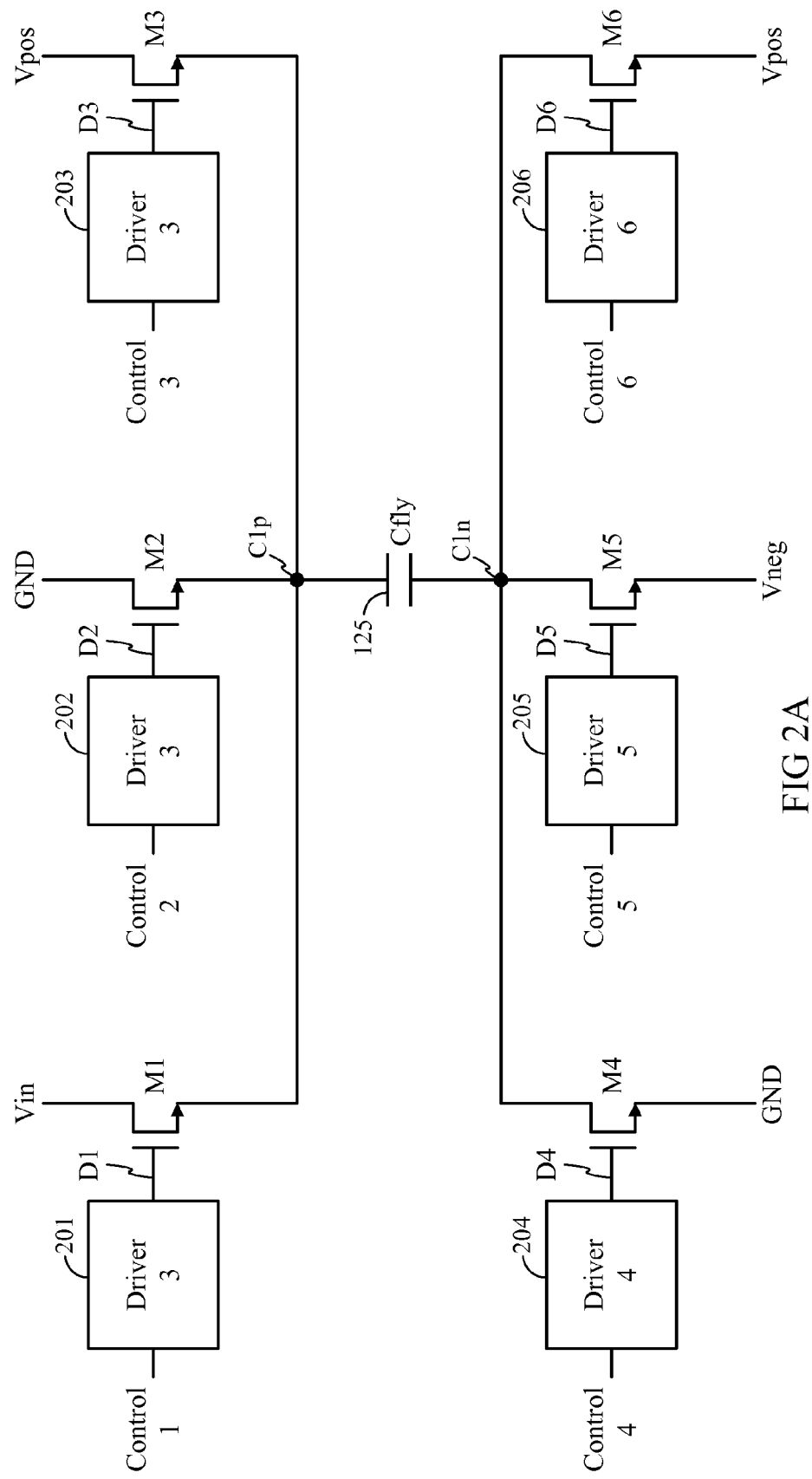
FIG. 2A illustrates an exemplary embodiment of the charge pump described with reference to FIG. 2, wherein the switches S1-S6 are implemented as a plurality of MOS transistors M1-M6.

FIG. 2A illustrates an exemplary embodiment of the charge pump described with reference to FIG. 2, wherein the switches S1-S6 are implemented as a plurality of MOS transistors M1-M6. Each of the transistors M1-M6 is driven by a corresponding driver 201-206, which may buffer control voltages Control 1-6 generated by, e.g., the switch control module 123. It will be appreciated that in certain exemplary embodiments, the sizes of the individual transistors, along with their driving circuits, may be varied with respect to each other, depending on the expected voltage and current load to be handled by each transistor.

Figure 3A:
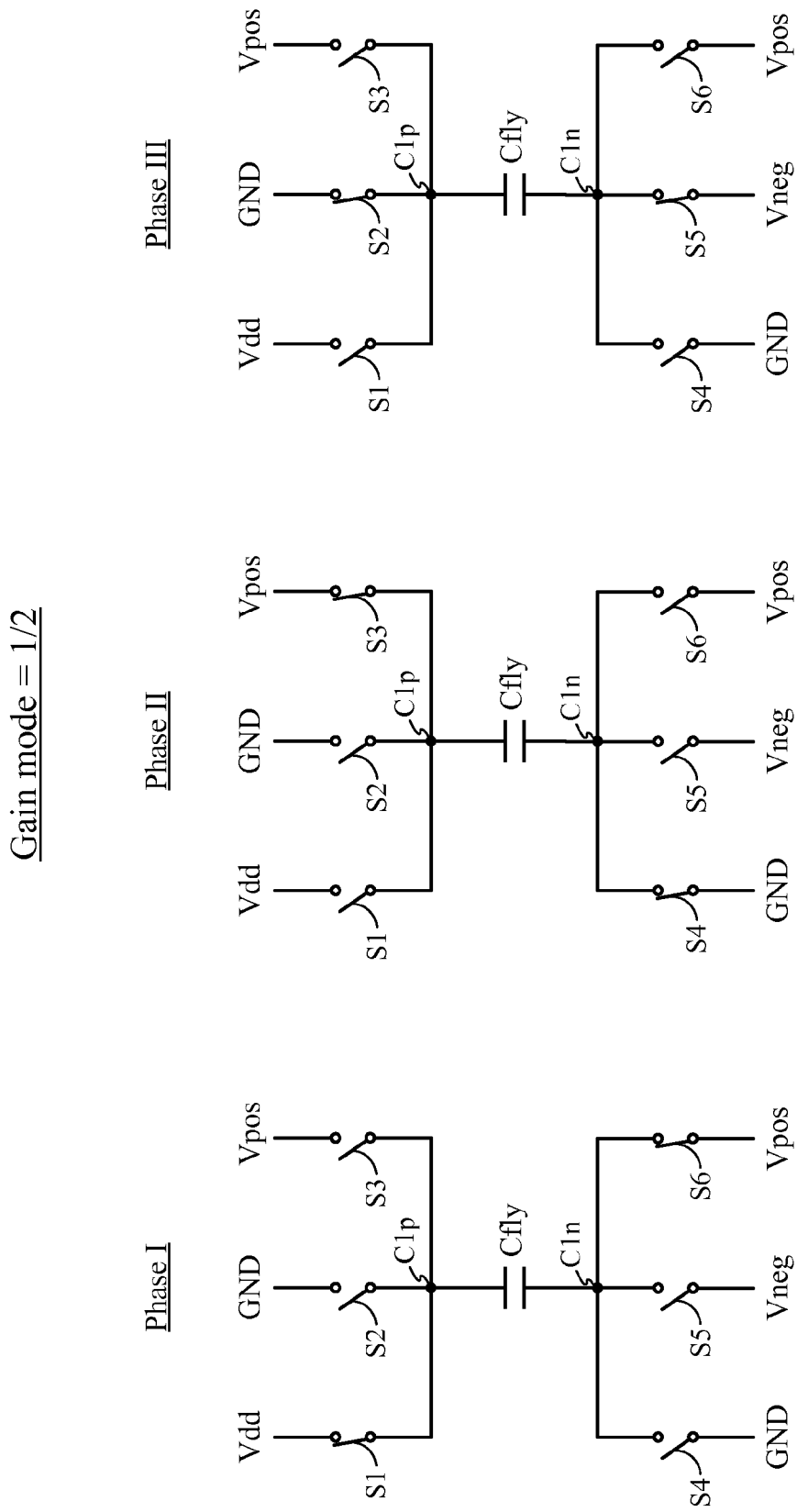
FIG. 3A illustrates exemplary configurations of the switches S1-S6 in the first gain mode, or Gain=½, over three phases.

FIG. 3A illustrates exemplary configurations of the switches S1-S6 in the first gain mode, or Gain=½, over three phases. As shown in FIG. 3A, during Phase I, nodes C1p and C1n of Cfly are coupled to Vdd and Vpos nodes, respectively. During Phase II, nodes C1p and C1n are coupled to Vpos and GND nodes, respectively. During Phase III, nodes C1p and C1n are coupled to GND and Vneg nodes, respectively.

It will be appreciated from the aforementioned configuration of switches that the total voltage across Cfly will approach Vdd/2 in steady state (subject to current drawn by a load module not shown), as Phases I and II effectively divide the supply voltage Vdd in half between Vpos and GND during Phases I and II. During Phase III, Cfly is inverted, and Vneg approaches −Vdd/2.

Figure 3B:
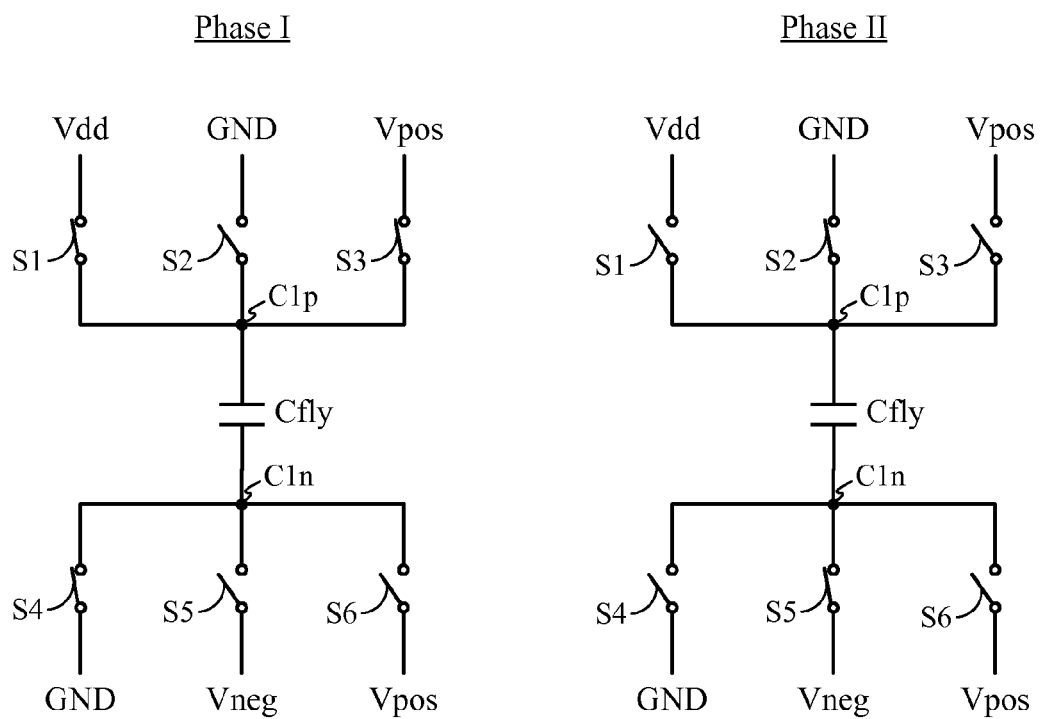
FIG. 3B illustrates the configuration of the switches in the second gain mode, or Gain=1, over two phases.

FIG. 3B illustrates the configuration of the switches in the second gain mode, or Gain=1, over two phases. As shown in FIG. 3B, during Phase I, node C1p of Cfly is coupled to both Vdd and Vpos, while node C1n of Cfly is coupled to GND. In this phase, the supply voltage Vdd directly charges the node C1p of Cfly via switch S1. Vdd is also coupled to the positive output voltage node Vpos via the series connection of switches S1 and S3, thereby charging one of the terminals of capacitor Cpos 161 (not shown in FIG. 3A). In Phase I, the total voltage across Cfly approaches Vdd, and Vpos also approaches Vdd.

During Phase II, nodes C1p and C1n are coupled to GND and Vneg nodes, respectively. In this phase, C1n is coupled to the negative output voltage node Vneg via the S5, thereby causing the voltage Vneg to approach −Vdd, and charging one of the terminals of capacitor Cneg 162 (not shown in FIG. 3B).

One of ordinary skill in the art will further appreciate that in alternative exemplary embodiments, the sequence of the phases need not be as shown in FIGS. 3A and 3B, and may instead be alternatively arranged. For example, any of the phases shown may be switched in sequence. Furthermore, it will be appreciated that in certain applications of the charge pump not requiring an inverted (negative) supply voltage, Phase III of gain mode=½ may be omitted. Such alternative exemplary embodiments are contemplated to be within the scope of the present disclosure.

Figure 4:
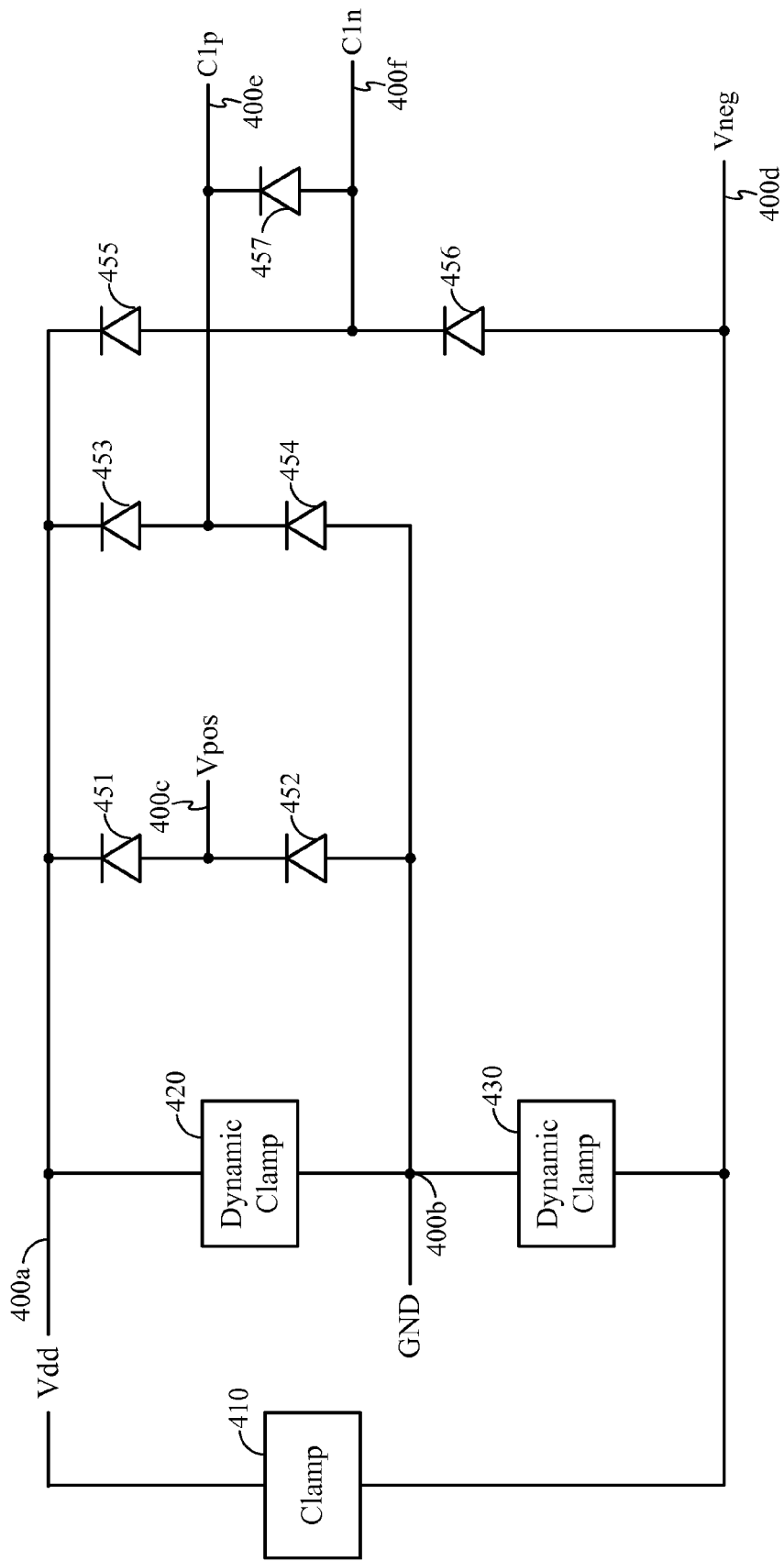
FIG. 4 illustrates an exemplary embodiment of an electrostatic discharge (ESD) protection scheme for terminals of the charge pump described with reference to FIG. 2.

FIG. 4 illustrates an exemplary embodiment of an electrostatic discharge (ESD) protection scheme for terminals of the charge pump described with reference to FIG. 2. Note the exemplary ESD protection scheme of FIG. 4 is shown for illustrative purposes only, and is not meant to limit the scope of the present disclosure.

In FIG. 4, nodes labeled 400a-400f correspond to terminals electrically coupled to Vdd, GND, Vpos, Vneg, C1p, and C1n, respectively. In an exemplary embodiment, each of the nodes may be coupled to an output pad that connects the respective terminal to an off-chip lead. As shown in FIG. 4, and further described hereinbelow, a plurality of clamps and reverse-biased protection diodes are provided between nodes to shunt current in case a high voltage accumulates between any of the nodes.

For example, in FIG. 4, a clamp 410 is provided between Vdd 400a and Vneg 400d. A dynamic clamp 420 is provided between Vdd 400a and GND 400b. A dynamic clamp 430 is provided between GND 400b and Vneg 400d. In an exemplary embodiment, the clamp 410 may be designed for a higher voltage than clamps 420 and 430, as clamp 410 is expected to support the highest voltage difference in the circuit between nodes Vdd and Vneg.

Figure 4A:
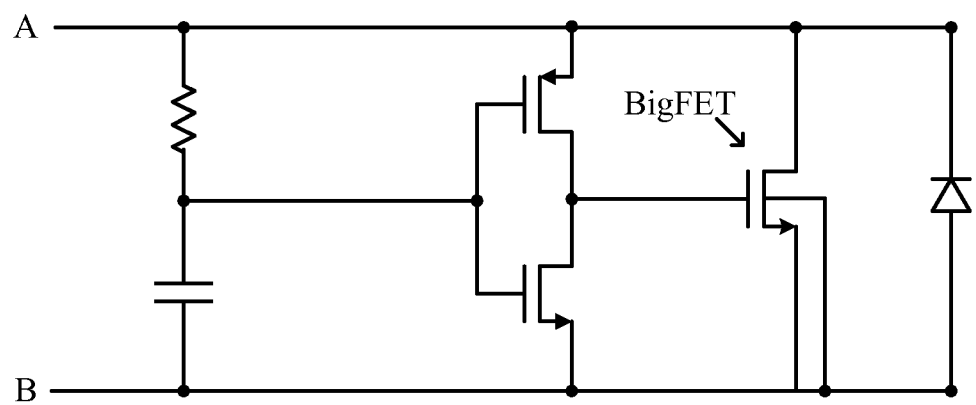
FIG. 4A illustrates an exemplary embodiment of the dynamic clamp.

In an exemplary embodiment, a dynamic clamp may denote, e.g., an RC-triggered very large field-effect transistor, or "BigFET," such as illustrated in FIG. 4A. It will be appreciated that such clamps may sense an ESD event between terminals A and B, and function to turn on the BigFET inside the clamp upon sensing such ESD event. Note the operation of the clamp in FIG. 4A will be clear to one of ordinary skill in the art in light of the principles disclosed herein. Further note that the dynamic clamp of FIG. 4A is shown for illustrative purposes only, and is not meant to limit the scope of the present disclosure to any particular implementation of a clamp.

Further shown in FIG. 4 is a reverse-biased diode 451 provided between Vdd 400a and Vpos 400c, and a reverse-biased diode 452 provided between Vpos 400c and GND 400b. Diodes 453 and 454 are similarly provided between Vdd 400a and C1p 400e, and C1p 400e and GND 400b, respectively. Diodes 455 and 456 are provided between Vdd 400a and C1n 400f, and C1n 400f and Vneg 400c, respectively. Finally, a diode 457 is provided between C1p 400e and C1n 400f.

It will be appreciated that during charge pump operation, when the charge pump gain is switched, e.g., from Gain=½ to Gain=1, a relatively large voltage transient may appear at the node 400d coupled to Vneg, due to the rapid change in the expected voltage level from −Vdd/2 to −Vdd. Such a voltage transient may undesirably cause leakage current in the dynamic clamp 430 coupling Vneg 400d to GND 400b. It would thus be advantageous to provide techniques for ESD protection at the node 400d coupled to Vneg that is optimized for the voltage swings expected during charge pump operation.

Figure 5:
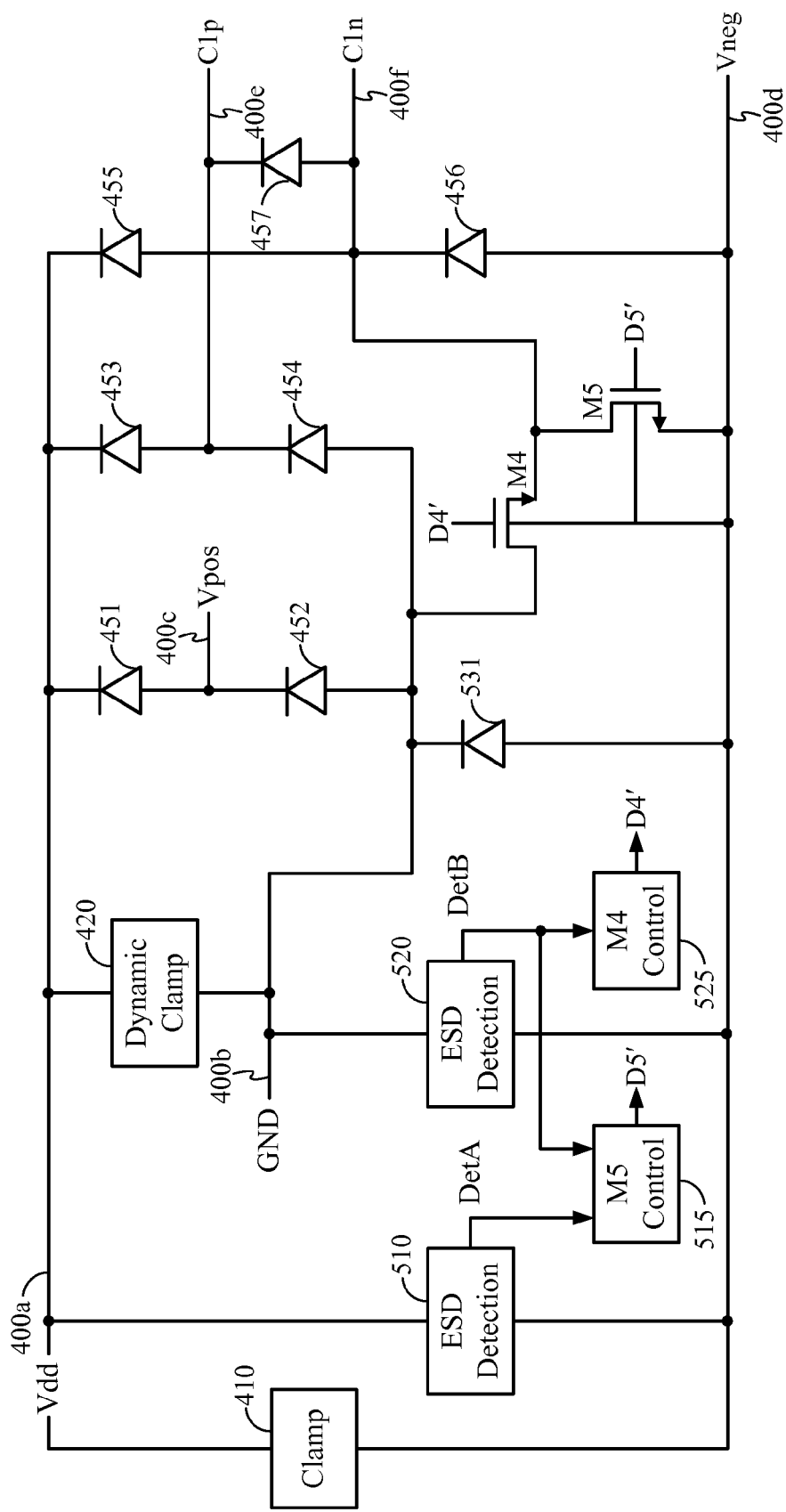
FIG. 5 illustrates an exemplary embodiment of an electrostatic discharge protection scheme for the charge pump described with reference to FIG. 2A.

FIG. 5 illustrates an exemplary embodiment of an electrostatic discharge protection scheme for the charge pump described with reference to FIG. 2A. Note the exemplary embodiment of FIG. 5 is shown for illustrative purposes only, and is not meant to limit the scope of the present disclosure. Similarly labeled elements in FIGS. 4 and 5 may correspond to elements performing similar functions, except as otherwise noted.

In FIG. 5, a first ESD detection module 510 is configured to detect an electrostatic discharge event between nodes Vdd 400a and Vneg 400d. The module 510 generates an indicator signal DetA, whose value is a logical high if the ESD event is detected, and low otherwise. Furthermore, a second ESD detection module 520 is configured to detect an electrostatic discharge event between nodes GND 400b and Vneg 400d. The module 520 generates an indicator signal DetB, whose value is a logical high if the ESD event is detected, and low otherwise. Note in this specification and in the claims, each of DetA and DetB may either denote a signal or a voltage, depending on the context, and such meaning will be clear to one of ordinary skill in the art.

In FIG. 5, transistor M4 is coupled between nodes GND 400b and C1n 400f. The transistor M4 shown in FIG. 5 may be identical to the switch transistor M4 shown in FIG. 2A, also denoted as the ground switch. In lieu of the driving voltage D4, however, which drives the transistor M4 in FIG. 2A, the driving voltage of M4 in FIG. 5 is a related voltage D4', which is generated by the M4 control module 525. The module 525 accepts the indicator signal DetB from module 520.

Transistor M5 is coupled between nodes C1n 400f and Vneg 400d. The transistor M5 shown in FIG. 5 may be identical to the switch transistor M5 shown in FIG. 2A, also denoted as the Vneg switch. In lieu of the driving voltage D5, which drives the transistor M5 in FIG. 2A, the driving voltage of M5 in FIG. 5 may be a related voltage D5', which may be generated by an M5 control module 515. Module 515 accepts the indicator signals DetA and DetB from modules 510 and 520, respectively.

According to the ESD protection scheme shown in FIG. 5, when an ESD event occurs between GND 400b and C1n 400f, ESD current flows from GND through ESD detection module 520 to Vneg, and further from Vneg to C1n through the diode 456. In response, the ESD detection module 520 sets the indicator signal DetB to high, and the M4 control module 525 correspondingly turns on transistor M4 using D4'. The turning on of M4 provides an electrically conductive path from GND to C1n, thus preventing excessive voltage from being built up between these nodes.

Similarly, when an ESD event occurs between C1n 400f and Vneg 400d, current flows from C1n through diode 455 to Vdd, and from Vdd to Vneg through the ESD detection module 510. In response, the ESD detection module 510 sets the indicator signal DetA to high, and the M5 control module 515 turns on transistor M5 using D5'. This provides a conductive path from C1n to Vneg.

Furthermore, when an ESD event occurs between GND and Vneg, the ESD detection module 520 sets the indicator signal DetB to high. In response, the M4 control module 525 and M5 control module 515 automatically turn on both transistors M4 and M5 via D4' and D5', respectively. This provides a conductive path from GND 400b to Vneg 400d via the series connection of M4 and M5.

Figure 6:
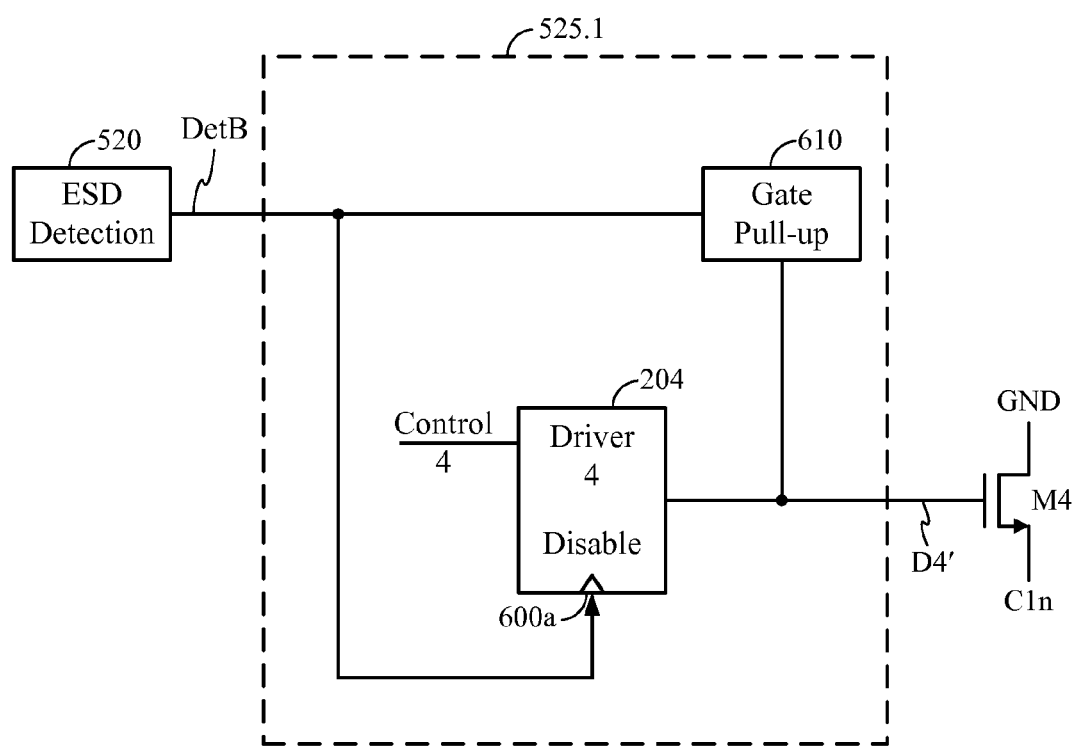
FIG. 6 illustrates an exemplary embodiment of the M4 control module 525 for generating the voltage D4' for driving M4.

FIG. 6 illustrates an exemplary embodiment of the M4 control module 525 for generating the voltage D4' for driving M4. Note functional blocks in FIG. 6 are shown for illustrative purposes only, and are not meant to limit the scope of the present disclosure. In alternative exemplary embodiments, it will be appreciated that any of the functional blocks may be combined, and/or additional logical elements clear to one of ordinary skill in the art may be introduced as needed. Such alternative exemplary embodiments are contemplated to be within the scope of the present disclosure.

In FIG. 6, the M4 driver 204 is provided with a disable input 600a, which upon activation may selectively turn off the driving capability of the M4 driver 204. The disable input 600a is coupled to the indicator signal DetB generated by the ESD detection module 520. The indicator signal DetB is further provided to a gate pull-up module 610. The gate pull-up module 610 is configured to pull the gate of M4 high in response to DetB being high, thereby turning on the transistor M4. When DetB is low, the gate pull-up module 610 may present a high impedance to the gate of M4.

Figure 7:
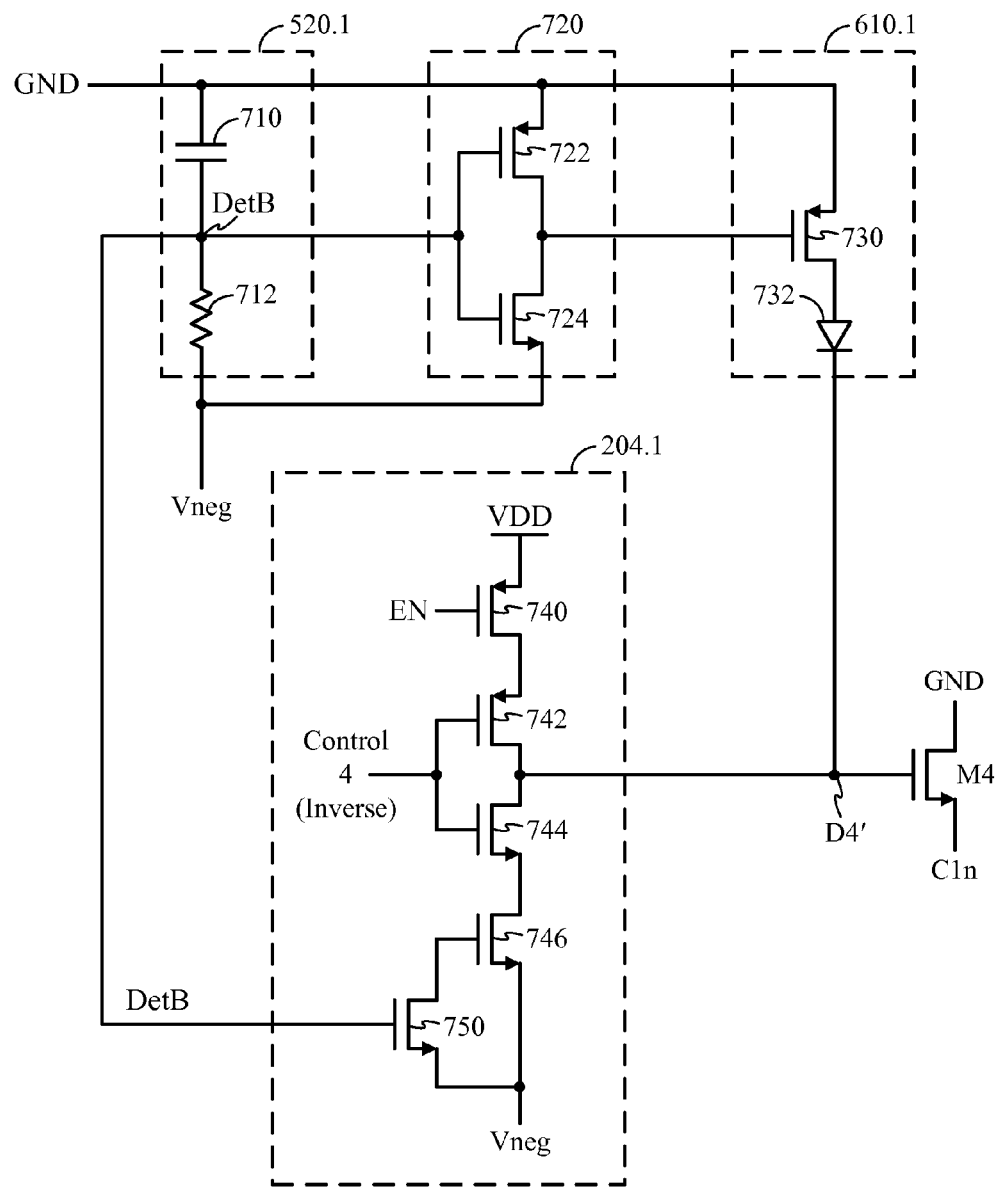
FIG. 7 illustrates exemplary circuitry for implementing the functions described hereinabove with reference to FIG. 6.

FIG. 7 illustrates exemplary circuitry for implementing the functions described hereinabove with reference to FIG. 6. Note the exemplary circuitry is shown for illustrative purposes only, and is not meant to limit the scope of the present disclosure to any particular implementation of the blocks described.

In FIG. 7, an exemplary ESD detection module 520.1 includes a capacitor 710 coupled to a resistor 712 at a node supporting the voltage DetB. In an exemplary embodiment, the capacitor 710 may be, e.g., 5 pF, and the resistor 712 may be, e.g., 200 kOhms. It will be appreciated that these values may be chosen to set a particular RC time constant, e.g., 1 microsecond, for the module 520.1. In an exemplary embodiment, the capacitor 710 may be an on-chip MOS capacitor. It will be appreciated that in the absence of current from GND to Vneg, the voltage DetB will remain close to Vneg, while a current surge from GND to Vneg will cause the voltage DetB to go high.

In FIG. 7, the voltage DetB is further coupled to an inverter 720 that includes transistors 722, 724. The output of the inverter 720 is coupled to an exemplary gate pull-up module 610.1. The module 610.1 includes a PMOS transistor 730 and a diode 732. It will be appreciated that when the transistor 730 is off, then the module 610.1 effectively forms an open circuit between the gate of M4 and GND. However, when the transistor 730 is turned on by the output of inverter 720, the diode 732 electrically couples the gate of M4 to GND, thus turning on M4.

Further shown in FIG. 7 is an exemplary M4 driver 204.1 including transistors 740, 742, 744, 746, whose operation may be disabled by a pull-down transistor 750 which can selectively turn off transistor 746.

Figure 8:
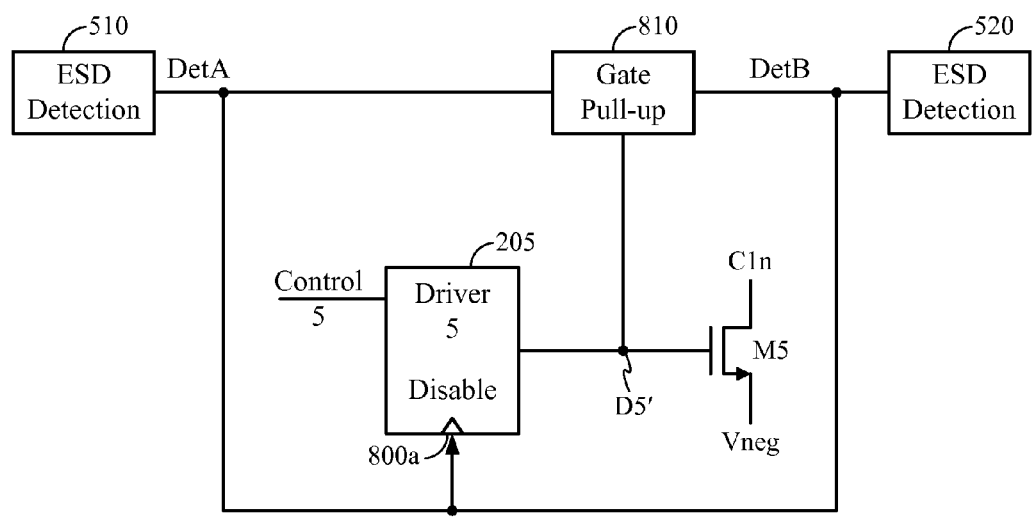
FIG. 8 illustrates an exemplary embodiment of the M5 control module 515 for generating the voltage D5' for driving M5.

FIG. 8 illustrates an exemplary embodiment of the M5 control module 515 for generating the voltage D5' for driving M5. As earlier described herein for the module 515, it will be appreciated that functional blocks in FIG. 8 are shown for illustrative purposes only, and are not meant to limit the scope of the present disclosure. In alternative exemplary embodiments, it will be appreciated that any of the functional blocks may be combined, and/or additional logical elements may be introduced as needed. Such alternative exemplary embodiments are contemplated to be within the scope of the present disclosure.

In FIG. 8, the M5 driver 205 is provided with a disable input 800a, which upon activation may selectively turn off the driving capability of the M5 driver 205. The disable input 800a is coupled both to the indicator signal DetA generated by the ESD detection module 510, and to the indicator signal DetB generated by the ESD detection module 520. Signals DetA and DetB are further provided to a gate pull-up module 810. The gate pull-up module 810 is configured to pull the gate of M5 high in response to either DetA or DetB being high, thus turning on the transistor M5. When DetA and DetB are both low, the gate pull-up module 810 may present a high impedance to the gate of M5.

Figure 9:
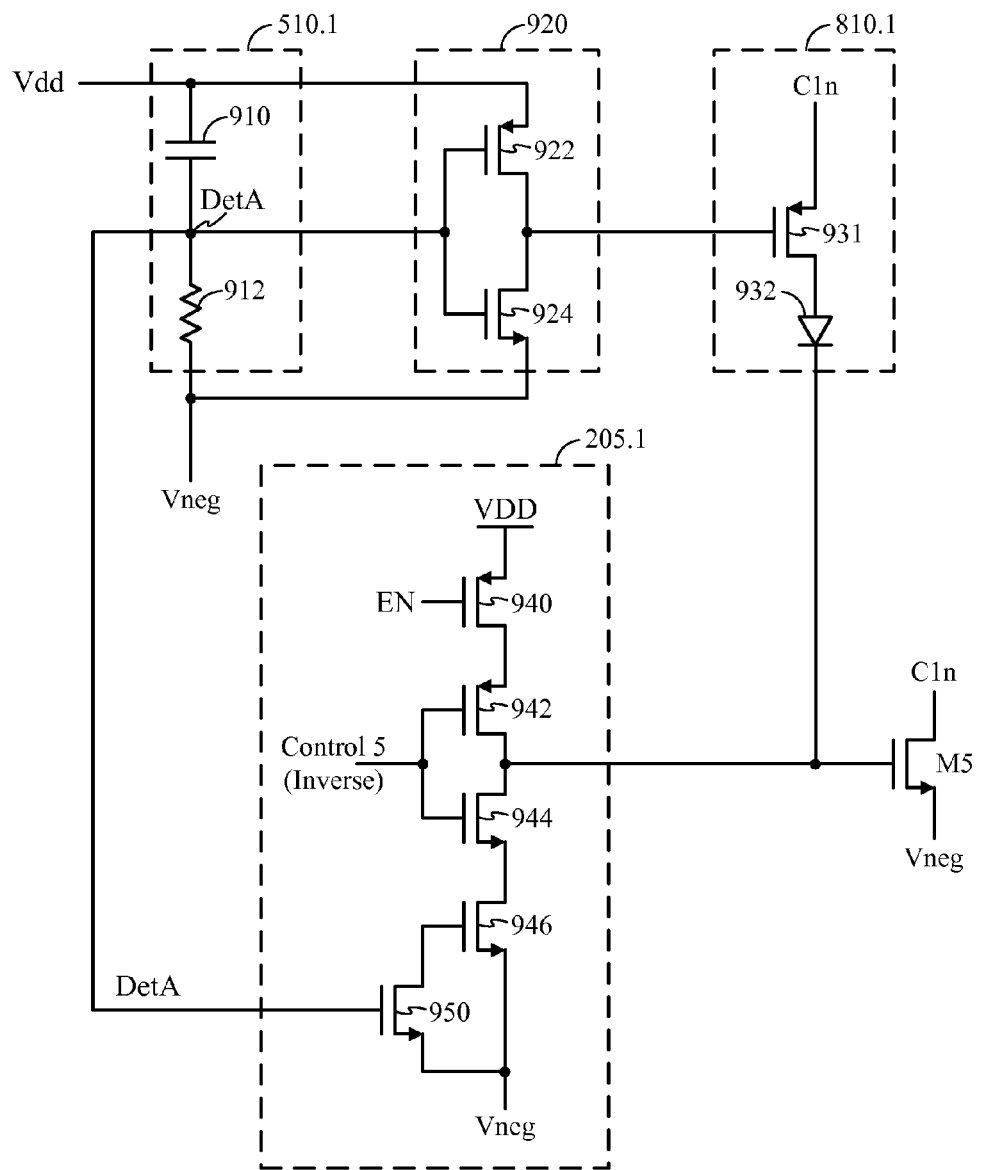
FIG. 9 illustrates exemplary circuitry for implementing the functions described hereinabove with reference to FIG. 8.

FIG. 9 illustrates exemplary circuitry for implementing the functions described hereinabove with reference to FIG. 8. Note the exemplary circuitry is shown for illustrative purposes only, and is not meant to limit the scope of the present disclosure to any particular implementation of the blocks described.

In FIG. 9, an exemplary ESD detection module 510.1 includes a capacitor 910 coupled to a resistor 912 at a node supporting the voltage DetA. In an exemplary embodiment, the capacitor 910 may be, e.g., 5 pF, and the resistor 912 may be, e.g., 200 kOhms. It will be appreciated that in the absence of current from Vdd to Vneg, the voltage DetA will remain close to Vneg, while a current surge from Vdd to Vneg will cause the voltage DetA to go high. In FIG. 9, the voltage DetA is further coupled to an inverter 920 that includes transistors 922, 924. The output of the inverter 920 is coupled to an exemplary gate pull-up module 810.1. The module 810.1 includes a PMOS transistor 930 and a diode 932. It will be appreciated that when the transistor 930 is off, then the module 810.1 effectively forms an open circuit between the gate of M5 and C1n. However, when the transistor 930 is turned on by the output of inverter 920, the diode 932 electrically couples the gate of M5 to C1n.

Further shown in FIG. 9 is an exemplary M5 driver 205.1 including transistors 940, 942, 944, 946, whose operation may be disabled by a pull-down transistor 950 which can selectively turn off transistor 946.

Figure 10:
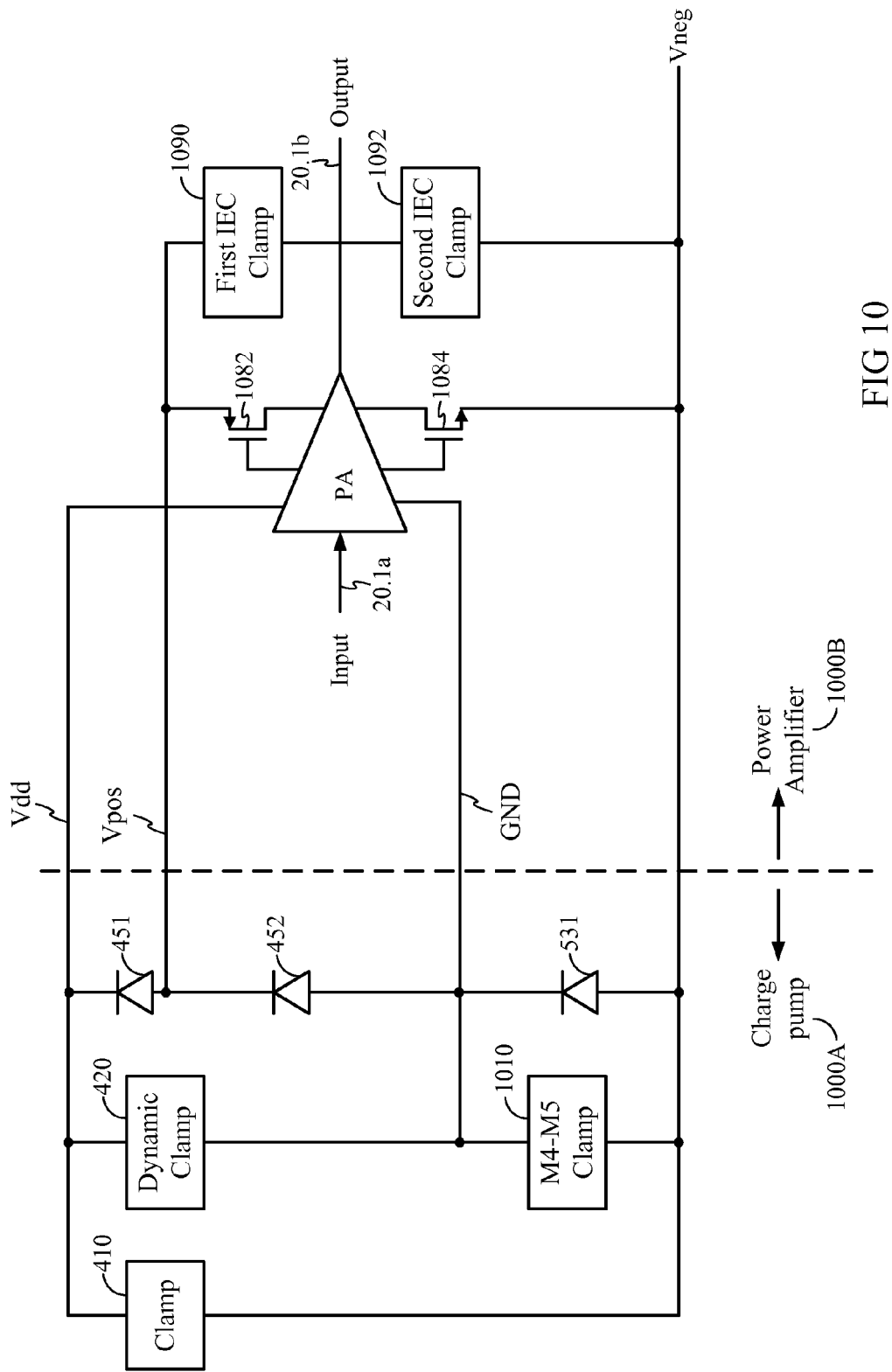
FIG. 10 illustrates an exemplary embodiment of a scheme for providing IEC level protection.

In a further aspect of the present disclosure, techniques are described for providing on-chip IEC level protection for a power amplifier. According to the International Electrotechnical Commission (IEC) 61000-4-2 ESD protection, the charge pump and power amplifier circuitry as described herein may be designed to withstand, e.g., an electrical discharge current of up to 30 amps at a power amplifier output pad with respect to GND. FIG. 10 illustrates an exemplary embodiment of a scheme for providing such IEC level protection. In FIG. 10, certain elements are labeled similarly to elements earlier described hereinabove. In such instances, it will be appreciated that similarly labeled elements may perform similar functions, unless otherwise noted.

In FIG. 10, a charge pump section 1000A is interfaced with a power amplifier section 1000B. In an exemplary embodiment, both the charge pump section 1000A and the power amplifier section 1000B may be provided on a single chip. Diodes 451, 452 and clamps 410, 420 are provided along with the M4-M5 clamp 1010 to provide ESD protection features for the charge pump 1000A as previously described hereinabove. In an exemplary embodiment, the M4-M5 clamp 1010 may implement the ESD protection techniques as described with reference to FIGS. 5-9.

In the power amplifier section 1000B, a power amplifier 20.1 is configured to amplify an input voltage at node 20.1a to generate an output voltage at node 20.1b. The charge pump output voltages Vpos and Vneg are provided through transistors 1082 and 1084, respectively, to drive the power amplifier output 20.1b. Note a dynamic clamp 1070 may be further provided between Vdd and GND.

In FIG. 10, a first IEC clamp 1090 is provided to clamp the output node 20.1b to Vpos, and a second IEC clamp 1092 is provided to clamp the output node 20.1b to GND. In an exemplary embodiment, each of the IEC clamps 1090, 1092 may be an on-chip snapback clamp, e.g., implemented as a grounded-gate NMOS (GGNMOS) transistor. It will be appreciated that providing the first IEC clamp 1090 may advantageously reduce the drain-to-source voltage across the PMOS transistor 1082 to be less than a holding voltage, e.g., 10 Volts, thereby preventing the PMOS transistor 1082 from going into a snap-back condition. In an exemplary embodiment, drain ballasting or a salicide block need not be provided for the PMOS transistor 1082, while the NMOS transistor 1084 may incorporate minimal drain ballasting, e.g., 0.43 microns.

It will be appreciated that when an ESD event involving a large positive voltage is present at the output node 20.1b, the second IEC clamp 1092 shunts the ESD current from the output node 20.1b to GND through the diode 531. When an ESD event involving a large negative voltage is present at the output node 20.1b, the ESD current is shunted from GND to the output node 20.1b through the diode 452 and the first IEC clamp 1090. Furthermore, a parallel conductive path is also present to shunt the ESD current from GND to the output node 20.1b through the M4-M5 clamp 1010 and a reverse diode present in the second IEC clamp 1092.

Figure 11:
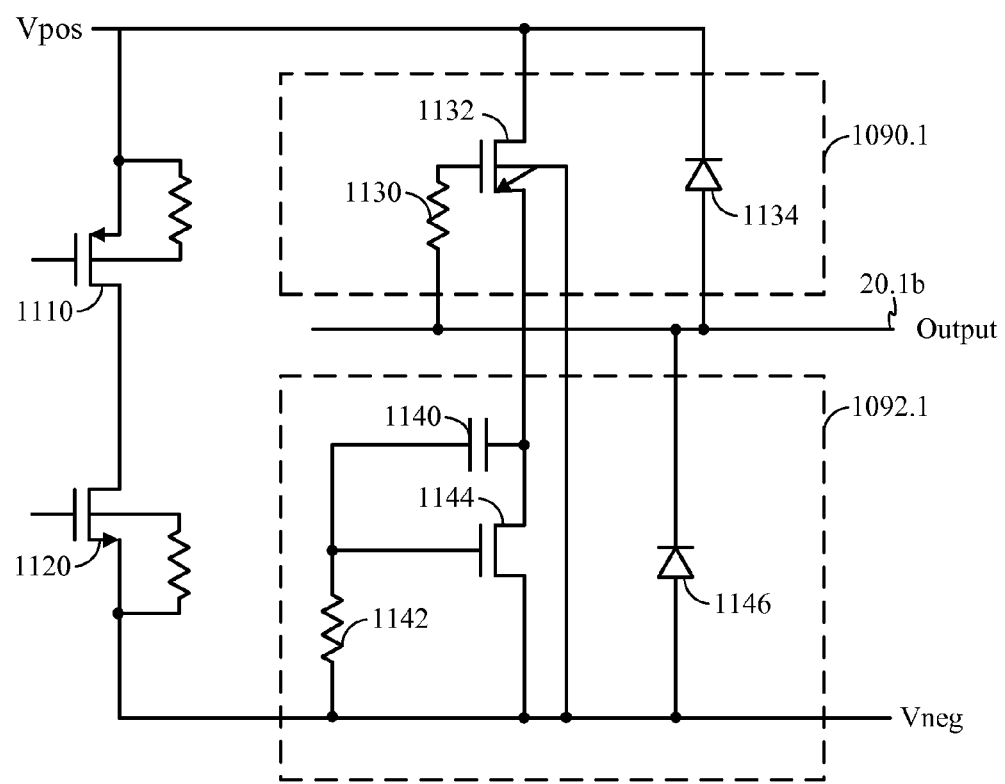
FIG. 11 illustrates an exemplary embodiment of first and second IEC clamps.

FIG. 11 illustrates an exemplary embodiment of first and second IEC clamps 1090 and 1092. In FIG. 11, the first clamp 1090.1 is a substrate-triggered snap-back clamp known in the art. As shown in FIG. 11, the substrate of NMOS 1132 is connected to Vneg. During a negative IEC event, when the pad voltage at Output 20.1b goes negative, then the body diode of NMOS 1132 turns on, thereby injecting current into the substrate of NMOS 1132, and turning on the parasitic BJT present inside the NMOS. The second clamp 1092.1 is a gate-pull snap-back clamp. The gate-pull on the NMOS will function to lower the threshold for avalanche breakdown of the drain-substrate diode of NMOS 1144. This helps the device enter into snapback mode (e.g., turning on the parasitic BJT within NMOS 1144) at the holding voltage of the device. If no gate pull is applied then the device would enter snapback at the trigger voltage of the device, which is much higher than the holding voltage. For example, the holding voltage may be 5V, and the trigger voltage may be 8V for an NMOS device.

Figure 12:
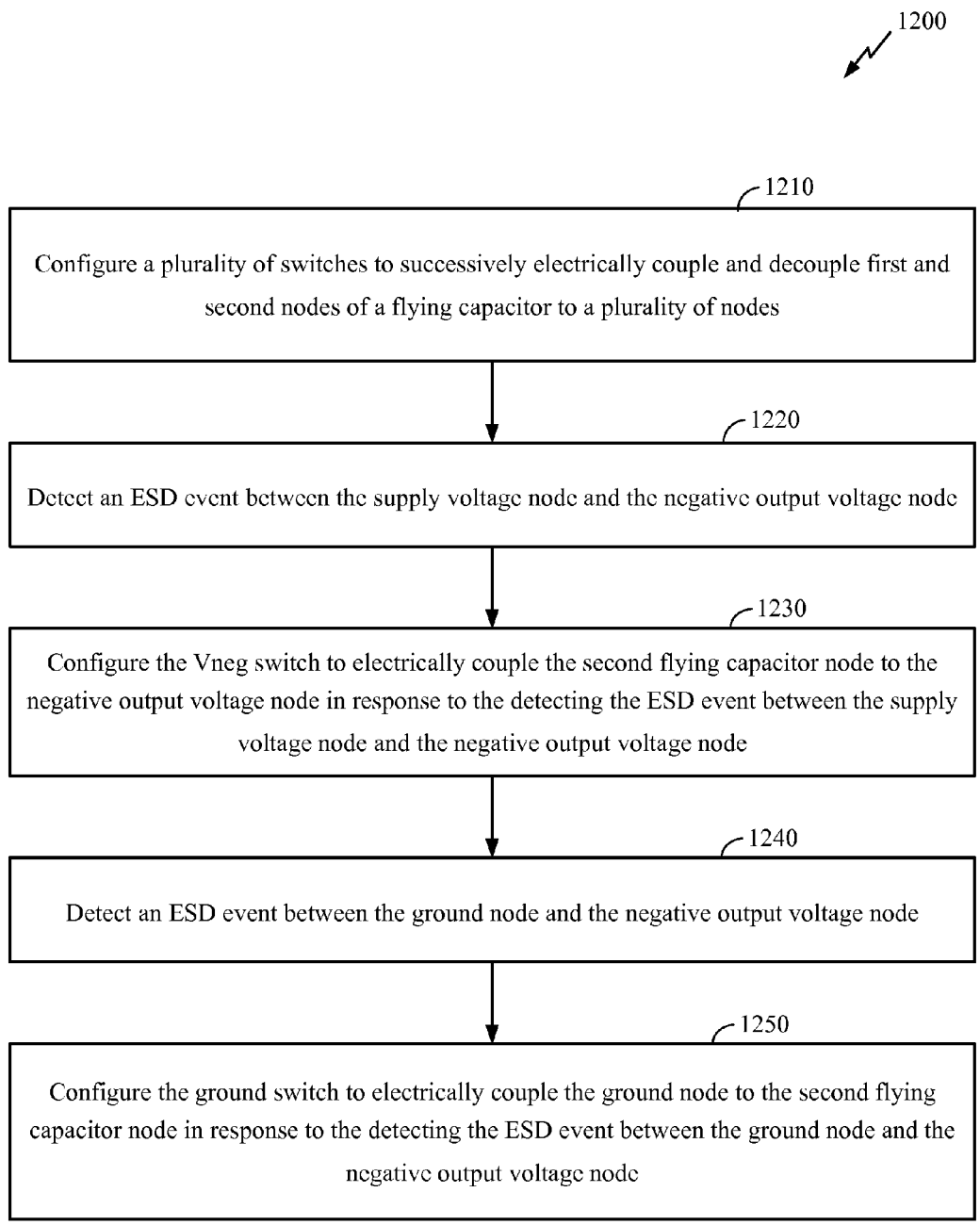
FIG. 12 illustrates an exemplary embodiment of a method according to the present disclosure.

FIG. 12 illustrates an exemplary embodiment of a method 1200 according to the present disclosure. Note the method of FIG. 12 is shown for illustrative purposes only, and is not meant to limit the scope of the present disclosure to any particular method shown.

In FIG. 12, at block 1210, a plurality of switches are configured to successively electrically couple and decouple first and second nodes of a flying capacitor to a plurality of nodes. The plurality of nodes may comprise a supply voltage node, a positive output voltage node, a negative output voltage node, and a ground node. In an exemplary embodiment, the plurality of switches comprises a Vneg switch coupling the second node of the flying capacitor to the negative output voltage node.

At block 1220, an ESD event is detected between the supply voltage node and the negative output voltage node.

At block 1230, the Vneg switch is configured to electrically couple the second flying capacitor node to the negative output voltage node in response to the detecting the ESD event between the supply voltage node and the negative output voltage node.

At block 1240, an ESD event is further detected between the ground node and the negative output voltage node.

At block 1250, the ground switch is configured to electrically couple the ground node to the second flying capacitor node in response to the detecting the ESD event between the ground node and the negative output voltage node In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Furthermore, when an element is referred to as being "electrically coupled" to another element, it denotes that a path of low resistance is present between such elements, while when an element is referred to as being simply "coupled" to another element, there may or may not be a path of low resistance between such elements.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary aspects of the invention.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary aspects disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary aspects is provided to enable any person skilled in the art to make or use the invention. Various modifications to these exemplary aspects will be readily apparent to those skilled in the art, and the generic principles defined herein may be applied to other exemplary aspects without departing from the spirit or scope of the invention. Thus, the present disclosure is not intended to be limited to the exemplary aspects shown herein but is to be accorded the widest scope consistent with the principles and novel features disclosed herein.

The invention claimed is:

1. An apparatus comprising:
a plurality of switches configured to successively electrically couple and decouple first and second nodes of a flying capacitor to a plurality of nodes, wherein the plurality of switches comprises a Vneg switch coupling the second node of the flying capacitor to a negative output voltage node; and
a first ESD detection module configured to detect an ESD event between a supply voltage node and the negative output voltage node, the Vneg switch configured to electrically couple the second flying capacitor node to the negative output voltage node in response to an ESD event detected by the first ESD detection module.

2. The apparatus of claim 1, wherein the plurality of switches further comprises a ground switch coupling the ground node to the second flying capacitor node, the apparatus further comprising:
a second ESD detection module configured to detect an ESD event between a ground node and the negative output voltage node, the ground switch further configured to electrically couple the ground node to the second flying capacitor node in response to an ESD detection event detected by the second ESD detection module.

3. The apparatus of claim 2, the Vneg switch further configured to electrically couple the second flying capacitor node to the negative output voltage node in response to an ESD event detected by the second ESD detection module.

4. The apparatus of claim 3, further comprising a diode forward-biased from the second flying capacitor node to the supply voltage node.

5. The apparatus of claim 2, the ground switch including an NMOS transistor, the apparatus further including a driving circuit for driving the NMOS transistor during normal charge pump operation, the driving circuit configured to be disabled in response to the ESD event detected by the second ESD detection module, the apparatus further including a second gate pull-up module configured to pull up the gate of the NMOS transistor of the ground switch in response to the ESD event detected by the second ESD detection module.

6. The apparatus of claim 5, the second ESD detection module comprising:
a capacitor coupling the ground node to a second ESD detection voltage node; and
a resistor coupling the second ESD detection voltage node to the negative output voltage node; the second gate pull-up module including:
a PMOS transistor including a source coupled to the second flying capacitor node; and
a diode coupling the drain of the PMOS transistor to the gate of the NMOS transistor of the ground switch, the diode forward-biased from the drain of the PMOS transistor to the gate of the NMOS transistor; the apparatus further including:
an inverter coupling the second ESD detection voltage node to the gate of the PMOS transistor of the second gate pull-up module.

7. The apparatus of claim 2, the second ESD detection module comprising:
a capacitor coupling the ground node to a second ESD detection voltage node; and
a resistor coupling the second ESD detection voltage node to the negative output voltage node.

8. The apparatus of claim 1, further comprising a diode forward-biased from the negative output voltage node to the second flying capacitor node.

9. The apparatus of claim 1, the Vneg switch comprising an NMOS transistor, the apparatus further comprising a driving circuit for driving the NMOS transistor during normal charge pump operation, the driving circuit configured to be disabled in response to the ESD event detected by the first ESD detection module, the apparatus further comprising a first gate pull-up module configured to pull up the gate of the NMOS transistor of the Vneg switch in response to the ESD event detected by the first ESD detection module.

10. The apparatus of claim 9, the driving circuit configured to be disabled in response to the ESD event detected by the second ESD detection module, the first gate pull-up module further configured to pull up the gate of the NMOS transistor of the Vneg switch in response to the ESD event detected by the second ESD detection module.

11. The apparatus of claim 9, the first ESD detection module comprising:
a capacitor coupling the supply voltage node to a first ESD detection voltage node; and
a resistor coupling the first ESD detection voltage node and the negative output voltage node; the first gate pull-up module comprising:
a PMOS transistor including a source coupled to the second flying capacitor node; and
a diode coupling the drain of the PMOS transistor to the gate of the NMOS transistor of the Vneg switch, the diode forward-biased from the drain of the PMOS transistor to the gate of the NMOS transistor; the apparatus further including:
an inverter coupling the first ESD detection voltage node to the gate of the PMOS transistor of the first gate pull-up module.

12. The apparatus of claim 11, the ground switch including an NMOS transistor, the apparatus further including a driving circuit for driving the NMOS transistor during normal charge pump operation, the driving circuit configured to be disabled in response to the ESD event detected by the second ESD detection module, the apparatus further including a second gate pull-up module configured to pull up the gate of the NMOS transistor of the ground switch in response to the ESD event detected by the second ESD detection module; the second ESD detection module comprising:
a capacitor coupling the ground node to a second ESD detection voltage node; and
a resistor coupling the second ESD detection voltage node to the negative output voltage node; the second gate pull-up module including:
a PMOS transistor including a source coupled to the second flying capacitor node; and
a diode coupling the drain of the PMOS transistor to the gate of the NMOS transistor of the ground switch, the diode forward-biased from the drain of the PMOS transistor to the gate of the NMOS transistor; the apparatus further comprising:
an inverter coupling the second ESD detection voltage node to the gate of the PMOS transistor of the second gate pull-up module.

13. The apparatus of claim 1, the first ESD detection module comprising:
a capacitor coupling the supply voltage node to a first ESD detection voltage node; and
a resistor coupling the first ESD detection voltage node to the negative output voltage node.

14. The apparatus of claim 1, further comprising:
  a power amplifier coupled to a positive output voltage node and the negative output voltage node, the power amplifier including an output node; and
  a first on-chip snapback clamp coupling the power amplifier output node to the positive output voltage node.

15. The apparatus of claim 14, the first on-chip snapback clamp including a substrate triggered snapback clamp.

16. The apparatus of claim 1, further comprising:
  a power amplifier coupled to a positive output voltage node and a negative output voltage node, the power amplifier including an output node; and
  a second on-chip snapback clamp coupling the power amplifier output node to the negative output voltage node.

17. The apparatus of claim 16, the second on-chip snapback clamp including a gate-pull snapback camp.

18. A method comprising:
  configuring a plurality of switches to successively electrically couple and decouple first and second nodes of a flying capacitor to a plurality of nodes, wherein the plurality of switches comprises a Vneg switch coupling the second node of the flying capacitor to a negative output voltage node; and
  detecting an ESD event between a supply voltage node and the negative output voltage node; and
  configuring the Vneg switch to electrically couple the second flying capacitor node to the negative output voltage node in response to the detecting the ESD event.

19. The method of claim 18, wherein the plurality of switches further comprises a ground switch coupling a ground node to the second flying capacitor node, the method further comprising:
  detecting an ESD event between the ground node and the negative output voltage node; and
  configuring the ground switch to electrically couple the ground node to the second flying capacitor node in response to the detecting the ESD event between the ground node and the negative output voltage node.

20. The method of claim 19, further comprising:
  configuring the Vneg switch to electrically couple the second flying capacitor node to the negative output voltage node in response to the detecting the ESD event between the supply voltage node and the negative output voltage node.

21. The method of claim 18, further comprising:
  amplifying an input voltage using a power amplifier to generate an output voltage at an output node, the power amplifier coupled to a positive output voltage node and the negative output voltage node; and
  coupling the power amplifier output node to the positive output voltage node using a first on-chip snapback clamp including a substrate-triggered snapback clamp.

22. The method of claim 18, further comprising:
  amplifying an input voltage using a power amplifier to generate an output voltage at an output node, the power amplifier coupled to a positive output voltage node and the negative output voltage node; and
  coupling the power amplifier output node to the negative output voltage node using a second on-chip snapback clamp including a gate-pull snapback clamp.

23. An apparatus comprising:
  a plurality of switches configured to successively electrically couple and decouple first and second nodes of a flying capacitor to a plurality of nodes, wherein the plurality of switches comprises a Vneg switch coupling the second node of the flying capacitor to a negative output voltage node; and
  means for configuring the Vneg switch to electrically couple the second flying capacitor node to the negative output voltage node in response to detecting an ESD event between a supply voltage node and the negative output voltage node.

24. The apparatus of claim 23, wherein the plurality of switches further comprises a ground switch coupling a ground node to the second flying capacitor node, the apparatus further comprising:
  means for configuring the ground switch to electrically couple the ground node to the second flying capacitor node in response to detecting an ESD event between the ground node and the negative output voltage node.

* * * * *